(12) United States Patent
Huth et al.

(10) Patent No.: US 7,946,470 B2
(45) Date of Patent: May 24, 2011

(54) METHOD FOR DEPOSITING SOLDER MATERIAL ON AN ELECTRONIC COMPONENT PART USING SEPARATORS

(75) Inventors: Kenneth J. Huth, Whitsett, NC (US); Lawrence C. Monterulo, Yonkers, NY (US)

(73) Assignee: Semx Corporation, Montvale, NJ (US)

( * ) Notice: Subject to any disclaimer, the term of this patent is extended or adjusted under 35 U.S.C. 154(b) by 253 days.

(21) Appl. No.: 11/523,895

(22) Filed: Sep. 19, 2006

(65) Prior Publication Data

US 2007/0152017 A1  Jul. 5, 2007

Related U.S. Application Data

(63) Continuation-in-part of application No. 11/323,444, filed on Dec. 30, 2005, now abandoned.

(51) Int. Cl.
*B23K 31/02* (2006.01)
*B23K 31/00* (2006.01)
(52) U.S. Cl. ............................... 228/180.22; 228/248.1
(58) Field of Classification Search ........................ None
See application file for complete search history.

(56) References Cited

U.S. PATENT DOCUMENTS

| | | | | |
|---|---|---|---|---|
| 2,979,024 A | * | 4/1961 | Pellekaan | 118/500 |
| 3,516,155 A | * | 6/1970 | Smith | 29/839 |
| 4,558,812 A | * | 12/1985 | Bailey et al. | 228/180.1 |
| 4,791,006 A | * | 12/1988 | Galvagni et al. | 427/282 |
| 4,914,814 A | * | 4/1990 | Behun et al. | 29/843 |
| 5,718,367 A | * | 2/1998 | Covell et al. | 228/254 |
| 5,956,606 A | * | 9/1999 | Burnette | 438/615 |
| 6,003,757 A | * | 12/1999 | Beaumont et al. | 228/246 |
| 6,024,275 A | * | 2/2000 | Takiar | 228/180.22 |
| 6,025,258 A | * | 2/2000 | Ochiai et al. | 438/613 |
| 6,105,851 A | * | 8/2000 | Norell et al. | 228/245 |
| 6,271,110 B1 | * | 8/2001 | Yamaguchi et al. | 438/613 |
| 6,295,730 B1 | * | 10/2001 | Akram | 29/843 |
| 6,444,563 B1 | * | 9/2002 | Potter et al. | 438/615 |
| 6,589,594 B1 | * | 7/2003 | Hembree | 438/106 |
| 6,622,773 B2 | * | 9/2003 | Farnworth | 164/80 |
| 6,832,747 B2 | * | 12/2004 | Cordes et al. | 249/119 |
| 6,855,623 B2 | * | 2/2005 | Ball | 438/612 |
| 2002/0092886 A1 | * | 7/2002 | Adriance et al. | 228/41 |
| 2006/0035454 A1 | * | 2/2006 | Belanger et al. | 438/616 |
| 2006/0234421 A1 | * | 10/2006 | Lo et al. | 438/106 |
| 2007/0246516 A1 | * | 10/2007 | Cordes et al. | 228/180.22 |

* cited by examiner

*Primary Examiner* — Kiley Stoner
*Assistant Examiner* — Carlos Gamino
(74) *Attorney, Agent, or Firm* — Charmasson, Buchaca & Leach, LLP

(57) ABSTRACT

A method for accurately depositing a required volume of solder material on a specific area of a lead frame, substrate or other part of an electronic component to be bonded by reflow of solder material to another part into a reliable, void-free connection during a subsequent assembly step comprises the following steps. Minute particles of solder material whose cumulative volume corresponds to the total volume to be deposited are loaded into a cavity cut into a fixture made from a material such as graphite. The cavity delineates the specific area of deposit. The part is then laid upon the fixture and immobilized thereon by a cover made from a material such as graphite. The fixture and its enclosed part are then subjected to solder material melting temperature under a controlled atmosphere in a furnace. The cavity is patterned and dimensioned to accommodate the right number of uniformly dimensioned particles necessary to precisely create the desired deposit of solder material.

21 Claims, 2 Drawing Sheets

METHOD FOR DEPOSITING SOLDER MATERIAL ON AN ELECTRONIC COMPONENT PART USING SEPARATORS

PRIOR APPLICATION

This is a continuation-in-part of application Ser. No. 11/323,444, filed Dec. 30, 2005 now abandoned incorporated herein by this reference.

FIELD OF THE INVENTION

This invention relates to microelectronic assemblies and packaging, and more particularly to the deposition of soldered strips or other shaped patches on electronic component parts such as lead frames, package lids, or substrates for later reflow and connection.

BACKGROUND

The extensive miniaturization of electronic circuits and their packaging requires the accurate deposition of minute, accurate quantity dabs, lines, or other shaped patches of solder over delineated areas of a component surface for future connecting of leads, lids and other parts by reflow.

The solder must be applied in controlled quantity and precisely on target in order to avoid bridging or unwanted gaps with other soldered points or circuit parts.

In the prior art, stamped soldered preforms are tack-welded to, or solder strips are laid on the electronic assembly or package in order to hold the solder in place for later remelting.

This invention results from attempts to devise a more precise method for depositing minute, accurate amounts of solder in precise locations without portions coming out of the demarcated area.

SUMMARY

The instant invention provides a method for accurately depositing a specified amount of solder material on a precisely delineated area on a surface of an electronic component part that will be subsequently subjected to reflow.

In some embodiments the method can used in order to establish a reliable and void-free connection with another component part. In some embodiments the component part may be a lead frame, package lid, substrate or other part. In some embodiments the volume of required solder material is calculated as the product of the area to be covered by the solder material times the desired height of the solder patch or strip. In some embodiments this volume is used to calculate the number or amount of solder material particles which are loaded into a cavity cut in the exposed surface of a fixture made of high density graphite or other crucible-type material having a melting temperature substantially higher than the melting point of the solder material. In some embodiments the delineated area of the part upon which the solder material is to be deposited can be positioned against the exposed surface of the fixture, and the combined fixture and part are exposed to a temperature at least as high as the melting temperature of the solder material in a batch or belt furnace under a controlled atmosphere.

In some embodiments the top surface of the fixture can be shaped and dimensioned for intimate contact with the solder material deposit area. In some embodiments the cavity carved into said exposed surface can be shaped to be congruent with the deposit area when the part is positioned against the fixture with the particles in contact with said area.

In some embodiments the part can be secured upon the fixture with a cover of the same high melting point material.

In some embodiments the particles can be laid in one or more rows into the cavity. In some embodiments the particles can be selected to have the same calculated, uniform range of dimensions and can be symmetrical, spherical, cylindrical or other shapes.

In some embodiments the cumulative volume of all the particles is equal to the total metered volume of solder material to be deposited.

In some embodiments the cavity has a constant depth which is greater than the diameter or size of the particles. In some embodiments the fixture and part are inverted prior to introduction into the furnace so that the particles drop into contact with the area of deposit.

In other embodiments the cavity has a depth that is lesser than the diameter or other appropriate size dimension of the particles and pressure is applied to the cover to hold the particles in position and assure a better adhesion of the solder to the part. In some embodiments the fixture may or may not be inverted during heating depending on the flow characteristics of the materials involved.

In some embodiments the cavity has an arcuate bottom whose radius is commensurate with the radius of the particles.

In some embodiments the bottom of the cavity has a series of spherical depressions, each dimensioned to intimately nest a particle of solder material. In some embodiments these depressions are regularly spaced apart at a calculated interval as a function of the total volume of solder material to be deposited and the number and size of the particles.

In some embodiments the cavity is widened and/or segmented to form one or more variably shaped ditches sized to be filled with an array of particles.

DESCRIPTION OF THE PREFERRED EMBODIMENTS

Figure 1:
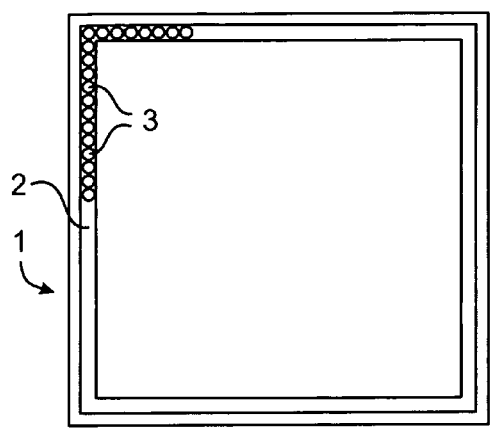
FIG. 1 is a top plan view of the top surface of the fixture.

Referring now to the drawing, there is shown in FIG. 1 the top surface of a fixture 1 according to the invention. The fixture 1 is particularly adapted for depositing a strip of solder in a marginal area around the periphery of the lid of a microcircuit component. A cavity in the form of an elongate channel 2 carved in the top surface of the fixture is shaped and dimensioned to be congruent to the area targeted to receive a deposit of solder material. The cavity 2 has been filled with a number of uniformly dimensioned particles of solder material selected in this case to be in the shape of spheres 3. The cumulative volume of all the spheres contained within the cavity corresponds to the total volume of solder material to be deposited. Using uniformly dimensioned particles allows for precise control of the total volume of solder material to be deposited.

Figure 2:
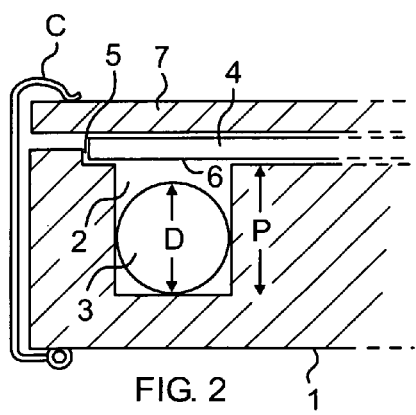
FIG. 2 is a diagrammatical cross-section of the cavity in a first embodiment of the fixture.

As more specifically illustrated in FIG. 2, the cavity 2 has a constant depth P that is greater than the diameter D of the spheres 3. The part upon which the solder material is to be deposited, in this case a microelectronic package lid 4, is held in a depression 5 in the top surface of the fixture that is shaped and dimensioned for intimate contact with the lower surface 6 of the lid. A cover 7 and releasable fastening means such as a clamp C is used to tightly secure the lid part 4 to the fixture 1.

Figure 3:
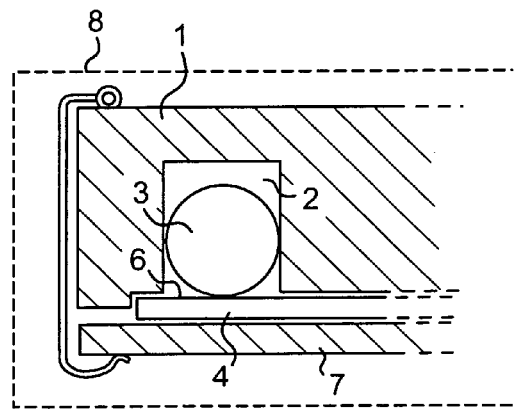
FIG. 3 is a partial diagrammatical cross-sectional view of the first embodiment of the fixture placed in a furnace.

The combined fixture, lid and cover is inverted prior to introducing it into a furnace 8 as shown in FIG. 3. The spheres 3 have dropped within the cavity 2 and come in contact with the lid 4. When the combination is subjected to a temperature at least as high as the melting temperature of the solder material melts and adheres to the under surface 6 of the lid.

Figure 4:
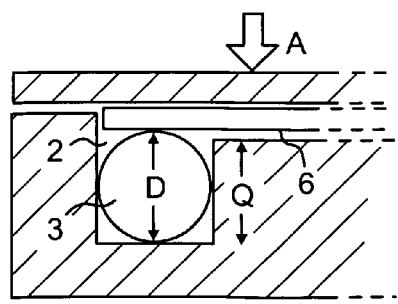
FIG. 4 is a diagrammatical cross-section of a second embodiment of the cavity section.

In the second embodiment of the cavity illustrated in FIG. 4, the depth Q of the cavity 2 is lesser than the diameter D of the spheres 3. In this case, it is not absolutely necessary, but will typically be recommendable to invert the combination fixture lid and cover prior to introduction into the melting furnace. The decision whether or not to invert will depend on the characteristics of the materials involved including wettability of the lid by the chosen solder material. A pressure A is preferably applied to the lid to force the spheres in constant contact with the under surface 6 of the lid, and assure a better adhesion of the melted solder material to the lid.

Figure 5:
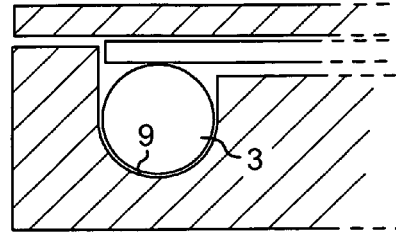
FIG. 5 is a diagrammatical cross-sectional view of the cavity section in a third embodiment of the fixture.

As shown in FIG. 5, the bottom 9 of the cavity 2 is preferably arcuate with a radius commensurate with the radius of the spheres 3.

Figure 6:
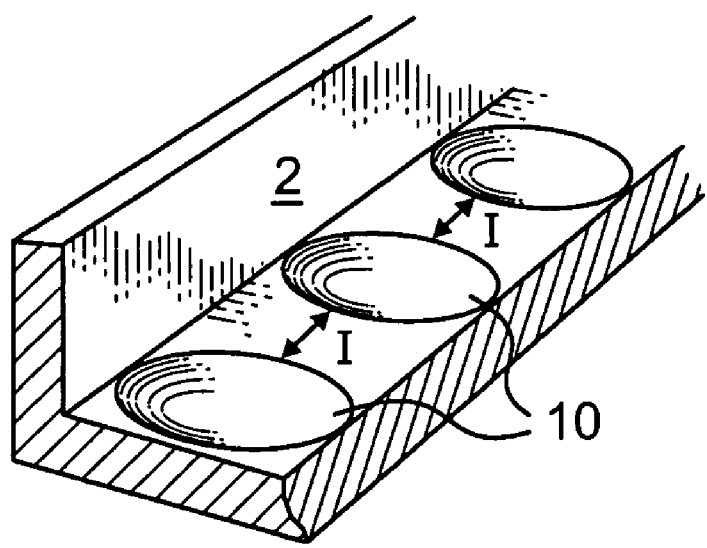
FIG. 6 is a perspective partial view of a fourth embodiment of the cavity section.

In a fourth embodiment of the cavity illustrated in FIG. 6, a series of holes 10 are carved at regularly spaced intervals I in the bottom of the cavity 2 to act as a localizer or separator for spaced apart particles. In this embodiment, each hole 10 is spherically concave and has the same radius as the spheres in order to intimately nest one of the spheres 3. It is noted that the hole radius can be slightly smaller than the spheres and still provide localization. Although the holes are shown having a partially spherical shape, other shapes either concave or convex which allow nesting or other localization of the spheres may be acceptable. The practicality of the selected shape is generally determined by which shape is easiest to form during the manufacturing of the fixture. Depending on the shape of the hole, the intended shape of the solder patch or strip, and the space formed between the hole boundaries and a nested particle, the fixture may require inverting prior to initiating melting.

Figure 7:
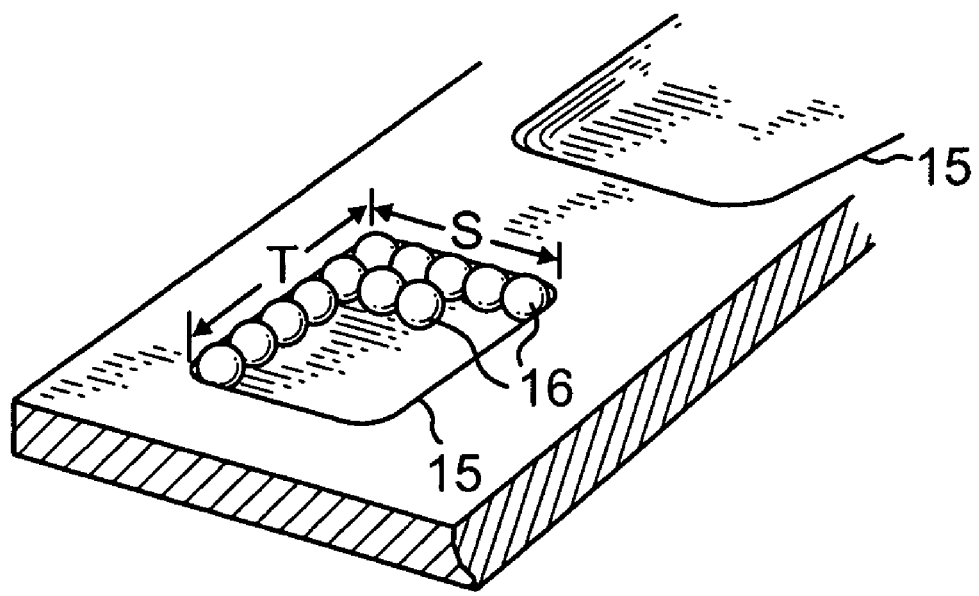
FIG. 7 is a perspective partial view of a fifth embodiment of the cavity section.

In a fifth embodiment of the cavity illustrated in FIG. 7, the cavity is segmented into one or more ditches 15 having a specified shape and dimensioning. The size and shape of the particles is selected to form an array of particles 16 nested within each ditch and to provide the required amount of solder material. For example, in a ditch having a rounded corner rectangular shape in a top plan view, and having a first side dimension S and an orthogonal side dimension T, spherical particles are selected having a diameter so that an integer multiple of the diameter will substantially equal S and another integer multiple will substantially equal T. Depending on the acceptable range of volume of solder material, the above equalities need not be exact. Further, the ditches can be shaped differently from one another depending on the shape and dimensioning of the delineated area to receive the solder material.

In a first step in the disclosed process, the total volume of solder material to be deposited on the delineated area of a component part is calculated by multiplying the area of deposit by the desired height of the solder material strip or patch. The width of the desired strip or dimensions of the desired patch of deposited solder material determines the shape and dimensions of the cavity, whether it is segmented into ditches, whether it uses particle separating structures, and the size or size range of the substantially uniformly dimensioned particles. The word "substantially" is used because the particles may not need to be exactly uniform but could fall within an acceptable range so that the completed strip or patch of solder material is adequately dimensioned. Use of uniformly dimensioned particles provides a means for precise control of the total volume of solder material to be deposited. For example, if spherical particles are used, then the maximum diameter D of the spheres and the number of spheres is determined by dividing the total volume of solder material to be deposited by the volume of each sphere. Depending upon that number, the spheres may be laid in a single row contiguous to each other as shown on FIG. 1, multiple rows as shown in FIG. 7, or may be spaced-apart using separator nesting structures 10 shown in the embodiment of the cavity illustrated in FIG. 6. The interval I between the nesting structures 10 in a row is determined as a function of the number of required spheres of solder material and the total length of that row in the cavity 2. All of the calculated dimensions are preferably displayed in a spread sheet bearing as entries the various determinant parameters such as the width and length of the delineated area to be covered by the solder material, the desired thickness of the material, the length and width of the cavity etc. according to well-known techniques for convenient use by the manufacturer.

In the embodiments of the cavity illustrated in FIGS. 2-5, the loading of the spheres into the fixture can be done by pouring the spheres into the depression 5 in the top surface of the fixture that is shaped and configured to receive the component part and may also include a gate for excess sphere removal. Once the cavity has been filled, the excess spheres can be swept away through the gate, not shown on the drawing, practiced in the periphery of the fixture. It is important to note that the loading of particles having a shape other than spheres can be done through pouring so long as the groups of particles are flowable. Such flowable groups of particles can be in the form of nanoparticles or flowable metal powders made from techniques well known in the electronics industry. Optionally, the fixture may be vibrated to avoid clumping of particles and encourage packed nesting.

The pressure A applied on the lid in the second embodiment of the cavity illustrated in FIG. 4, is preferably imparted by a spring pressure clamp in the range of 750 to 1,000 milligrams (about 1.5 to 2 lbs.).

The oven is purged of all air and filled with a controlled atmosphere conducive to reflow of the solder material by being non-oxidizing and can be for example made of 5 percent hydrogen and 95 percent nitrogen. The temperature of the oven is then raised above the melting point of the solder material for a period of time sufficient to melt and join the particles.

In most applications, the delineated area of the component part upon which the solder material must be deposited is coated with gold for best adhesion with a solder material consisting of a gold alloy such as AuSn, AuGe, AuSi, and AuAgCu, or other alloys such as AgCu, PbSnAg or other known solder or brazing material which can include some metal alloys of gold, tin, lead, copper, and silver. The oven should be raised to a temperature that will melt the solder, such as about 340 degrees Celsius for AuSn solder, for approximately 15 minutes in order to assure complete melting and joining of the solder material and best adhesion to the component part.

While the preferred embodiments of the invention have been described, modifications can be made and other embodiments may be devised without departing from the spirit of the invention and the scope of the appended claims.

What is claimed is:

1. A method for accurately depositing a metered volume of solder material of a given melting point on a delineated area of an electronic component part, said method comprising the steps of:
   providing a fixture having a top surface shaped and dimensioned for intimate contact with said area, and a melting temperature substantially higher than said melting point;
   carving into said top surface a closed-ended cavity shaped to be congruent with said area, wherein said cavity has a series of spaced-apart bottom separators;
   pouring into said cavity said solder material,
      wherein said solder material is a plurality of substantially uniformly dimensioned flowable particles, and
      wherein a single particle is intimately nested in and spaced apart by each separator;
   positioning said part against said top surface and said particles in contact with said area; and
   exposing said fixture and part to a temperature at least equal to said melting point;
      wherein said particles melt and join together to cover and adhere to said area.

2. The method of claim 1 which further comprises securing said part upon said fixture with a cover.

3. The method of claim 1, wherein said fixture is made of a material comprising high density graphite.

4. The method of claim 1, wherein said solder material comprises a metal alloy selected from the group consisting of gold alloys, tin alloys, lead alloys, copper alloys, and silver alloys.

5. The method of claim 1, wherein said solder material comprises a metal alloy selected from the group consisting of AuSn, AuGe, AuSi, AuAgCu, AgCu, and PbSnAg.

6. The method of claim 1, wherein said delineated area comprises an electronic package lead frame.

7. The method of claim 1, wherein said delineated area comprises a marginal, peripheral area of a microelectronic package lid.

8. The method of claim 1, wherein said cavity is segmented into a plurality of ditches.

9. The method of claim 8, wherein two of said plurality of ditches are differently dimensioned.

10. The method of claim 1, wherein said particles are laid in a single row into said cavity.

11. The method of claim 1, which further comprises vibrating said fixture to avoid clumping of said particles.

12. The method of claim 1, wherein said particles are laid in a plurality of rows into said cavity.

13. The method of claim 1, wherein said particles are symmetrical, and have calculated dimensions.

14. The method of claim 1, wherein said particles are spherical, and have a calculated diameter and radius.

15. The method of claim 14, wherein said cavity has a constant depth greater than said diameter.

16. The method of claim 14, wherein said cavity has a constant depth lesser than said diameter.

17. The method of claim 14, wherein said cavity has an arcuate bottom.

18. The method of claim 1, which further comprises sweeping away an excess number of said particles.

19. The method of claim 1, wherein said step of positioning comprises inverting said fixture and part.

20. The method of claim 1, which further comprises pressing said part against said fixture.

21. The method of claim 1, wherein said separators are regularly spaced-apart at a calculated interval.

* * * * *